(12) United States Patent
Kreifels et al.

(10) Patent No.: US 6,597,605 B2
(45) Date of Patent: Jul. 22, 2003

(54) SYSTEMS WITH NON-VOLATILE MEMORY BIT SEQUENCE PROGRAM CONTROL

(75) Inventors: Jerry A. Kreifels, El Dorado Hills, CA (US); Rodney R. Rozman, Placerville, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/139,057

(22) Filed: May 3, 2002

(65) Prior Publication Data

US 2002/0126537 A1 Sep. 12, 2002

Related U.S. Application Data

(63) Continuation of application No. 09/603,671, filed on Jun. 26, 2000, now Pat. No. 6,418,059.

(51) Int. Cl.$^7$ ................................................. G11C 7/00
(52) U.S. Cl. .......................... 365/185.28; 365/185.14; 365/185.18; 365/236; 365/239
(58) Field of Search ....................... 365/185.01, 185.14, 365/185.18, 185.28, 236, 239

(56) References Cited

U.S. PATENT DOCUMENTS

| | | | |
|---|---|---|---|
| 5,053,990 A | 10/1991 | Kreifels et al. | |
| 5,280,447 A | 1/1994 | Hazen et al. | |
| 5,379,413 A | 1/1995 | Hazen et al. | |
| 5,414,669 A | 5/1995 | Tedrow et al. | |
| 5,414,829 A | 5/1995 | Fandrich et al. | |
| 5,430,674 A * | 7/1995 | Javanifrad ................... | 365/185 |
| 5,523,972 A | 6/1996 | Rashid et al. | |
| 5,537,350 A * | 7/1996 | Larsen et al. .......... | 365/185.33 |
| 5,546,410 A | 8/1996 | Ando | |
| 5,815,443 A | 9/1998 | Sweha et al. | |
| 5,907,700 A | 5/1999 | Talreja et al. | |
| 5,910,180 A | 6/1999 | Flory et al. | |
| 5,937,424 A | 8/1999 | Leak et al. | |
| 5,954,818 A | 9/1999 | Dalvi et al. | |
| 5,966,723 A | 10/1999 | James et al. | |
| 6,418,059 B1 * | 7/2002 | Kreifels et al. ........ | 365/185.28 |

OTHER PUBLICATIONS

V. Siva Kumar, OTP EPROMs with Quick–Pulse Programming offer ideal mass production firmware storage, Memory Components Handbook, Intel Corporation, 1989, p 4–373–4–375.

S. Zales & D. Elbert, Using the 28F256 Flash Memory for In–System Reporgrammable Nonvolatile Storage, Memory Components Handbook, Intel 1989, p 5–89–5–122.

Elbert, Nogo & Zales, The 27F64 Flash Memory—Your Solution for On–Board Programming, Memory Components Handbook, Intel Corporation, 1989, p 5–79–5–87.

Intel Corporation, 64K (8K×8) CHMOS Flash Memory, Memory Components Handbook, Intel Corporation, 1989, p 5–15 –5–35.

(List continued on next page.)

Primary Examiner—Viet Q. Nguyen
(74) Attorney, Agent, or Firm—Blakely, Sokoloff, Taylor & Zafman LLP

(57) ABSTRACT

Systems including a bit sequence program controller to program in sequence non-volatile memory cells in an array of programmable non-volatile memory cells. The bit sequence program controller determines the bits that require programming by comparing the bits of the program word with an erased logical state of the array of programmable non-volatile memory cells. The bit sequence program controller further indicates which non-volatile memory cells in a word of non-volatile memory cells in the array of non-volatile memory cells require programming to match the program word. The bit sequence program controller counts the number of the bits that require programming in the program word by counting the number of bits of the program word that are not in an erased logical state to determine when the programming should be completed.

48 Claims, 11 Drawing Sheets

OTHER PUBLICATIONS

K. Robinson, Using Simple Circuits, Algorithms to Program 521k–bit EPROMS, Memory Components Handbook, Intel Corporation, 1989, p 4–354–359.

Johnson, Kuh, Renninger & Perlegos, 16-K EE–PROM Relies on Tunneling for Byte–Erasable Program Storage, Memory Components Handbook, Intel Corporation, 1989.

Knowlton, Versatile Algorithm, Equipment Cut EPROM Programing Time, Memory Components Handbook, Intel Corporation, 1989, p 4–12–4–16.

Davis, Programming Intel's 27256 EPROM, Memory Components Handbook, Intel Corporation, 1989, p 4–2–4–5.

Intel Corporation, 16K (2K×8) Electrically Erasable PROM, Memory Components Handbook Intel Corporation, 1989, p 5–95–5–103.

M. Vanbuskirk, et al., E–PROMs Graduate to 256–K Densit with Scaled N–Channel Process, Memory Components Handbook, Intel Corporation, 1989, P 4–6 –4–11.

Intelcorporation, 16K (2K×8) Electrically Erasable PROM, Memory Components Handbook, Intel Corporation, 1989 p 5–83–5–94.

Dorf, Nonvolatile Programmable Memories, The Electrical Engineering Handbook, CRC Press, Florida, p 1654–1655, 1993.

Prince, EPROM Memory Cell: Floating Gate Avalanche Injection MOS, Semiconductor Memories, John Wiley & Sons, West Sussex, England, 1991, p 102–103.

Prince, Overview of Non–Volatile MOS Memories, Semiconductor Memories, John Wiley & Sons, West Sussex, England, 1991, p 142–187.

Prince, Field Alterable ROMs I: EPROM, OTP, and Flash Memories, Semiconductor Memories, John Wiley & Sons, West Sussex, England, 1991 p 529–608.

Prince, Field Alterable ROMs II: EEPROM, EAROM, NV–RAM, Semiconductor Memories, John Wiley & Sons, West Sussex, England, 1991, p 609–662.

* cited by examiner

FIG. 5B

CD_FOUND[2:0]_PREV => These 3 bits count the number of "0's" found in the data word.
For Example:

| 502B CD_FOUND2 | 501B CD_FOUND1 | 500B CD_FOUND0 | What it means: |
|---|---|---|---|
| 0 | 0 | 0 | NO "0's" have been found. |
| 0 | 0 | 1 | ONE "0" has been found. |
| 0 | 1 | 0 | TWO "0's" have been found. |
| 0 | 1 | 1 | THREE "0's" have been found. |
| 1 | 0 | 0 | FOUR "0's" have been found. |
| 1 | 0 | 1 | RESERVED |
| 1 | 1 | 0 | RESERVED |
| 1 | 1 | 1 | RESERVED |

FIG. 5C

Truth table:

Inputs / Outputs:

| 504 CDLAT (incoming data bit from SDLATCH) ("1" = PGM) | 418A CD_FOUND2_PREV (502A) | 418A CD_FOUND1_PREV (501A) | 418A CD_FOUND0_PREV (500A) | CD_PGM_LOAD ("1" = PGM) | 418B CD_FOUND2_NEW (502B) | 418B CD_FOUND1_NEW (501B) | 418B CD_FOUND0_NEW (500B) |
|---|---|---|---|---|---|---|---|
| 0 | 0 | 0 | 0 | 0 | 0 | 0 | 0 |
| 0 | 0 | 0 | 1 | 0 | 0 | 0 | 1 |
| 0 | 0 | 1 | 0 | 0 | 0 | 1 | 0 |
| 0 | 0 | 1 | 1 | 0 | 0 | 1 | 1 |
| 0 | 1 | 0 | 0 | 0 | 1 | 0 | 0 |
| 0 | 1 | 0 | 1 | x | x | x | x |
| 0 | 1 | 1 | 0 | x | x | x | x |
| 0 | 1 | 1 | 1 | x | x | x | x |
| 1 | 0 | 0 | 0 | 1 | 0 | 0 | 1 |
| 1 | 0 | 0 | 1 | 1 | 0 | 1 | 0 |
| 1 | 0 | 1 | 0 | 1 | 0 | 1 | 1 |
| 1 | 0 | 1 | 1 | 1 | 1 | 0 | 0 |
| 1 | 1 | 0 | 0 | 1 | 1 | 0 | 0 |
| 1 | 1 | 0 | 1 | x | x | x | x |
| 1 | 1 | 1 | 0 | x | x | x | x |
| 1 | 1 | 1 | 1 | x | x | x | x |

Inputs: Number of bits to be PGM'd prior to this bit.
Outputs: Number of bits to be PGM'd including this bit.

| CD PGM 16 | 1 | 0 | 0 | 0 | 0 | X | 1 | 1 |
|---|---|---|---|---|---|---|---|---|
| NUMBER OF ZEROS | 0 | 3 | 2 | 1 | 0 | X | 0 | 0 |
| CD FOUND 0 PREV 0 | 0 | 1 | 0 | 1 | 0 | X | 0 | 1 |
| CD FOUND 1 PREV 0 | 0 | 1 | 1 | 0 | 0 | X | 0 | 0 |
| CD FOUND 2 PREV 0 | 0 | 0 | 0 | 0 | 0 | X | 0 | 0 |

| PARALLEL PROGRAM NUMBER LDNIBNUM | | | NUMBER OF BITS PROGRAMMED IN PARALLEL |
|---|---|---|---|
| 2 | 1 | 0 | |
| 0 | 0 | 0 | 16 (DEFAULT) |
| 0 | 0 | 1 | 1 |
| 0 | 1 | 0 | 2 |
| 0 | 1 | 1 | 3 |
| 1 | 0 | 0 | 4 |
| 1 | 0 | 1 | RESERVED |
| 1 | 1 | 0 | 16 |
| 1 | 1 | 1 | 16 |

*FIG. 5E*

SYSTEMS WITH NON-VOLATILE MEMORY BIT SEQUENCE PROGRAM CONTROL

CROSS REFERENCE TO RELATED APPLICATION

This application is a continuation of application Ser. No. 09/603,671, filed Jun. 26, 2000 by Jerry A. Kreifels and Rodney R. Rozman, now issued as U.S. Pat. No. 6,418,059B1.

BACKGROUND OF THE INVENTION

1. Field of the Invention

The present invention relates generally to non-volatile programmable memory, and specifically to programming an array of electrically programmable non-volatile memory cells.

2. Background Information

Non-volatile programmable memories are well known. One of the earliest non-volatile programmable memories were one time programmable (OTP) memory cells which used a diode or transistor with a fuse or an antifuse to program the cell to indicate a logical one or a logical zero when the cell was addressed. Another initially one time programmable memory cell was an electrically programmable read only memory (EPROM) cell. The EPROM was a transistor that was electrically programmable by storing a trapped charge underneath its gate. The trapped charge underneath the gate changed the gate to source threshold voltage of the EPROM. The gate to source threshold voltage was the voltage level above which the EPROM transistor would turn on to conduct a current between its source and drain. The EPROM cell later became erasable by using ultraviolet light radiating through windows in an integrated circuit to reduce or remove the trapped charge so the threshold voltage would return to normal. The UV erasing of the EPROM cell allowed it to be multiprogrammable. However, UV erasing required removal of the integrated circuit from a printed circuit board. To avoid the UV erasing, an electrically erasable programmable read only memory (EEPROM) cell was introduced. The EEPROM memory cell made it possible to program while it remained in circuit on the printed circuit board. In order to be both electrically erasable and programmable, the EEPROM cell included a transistor that uses a floating gate to store a charge. A charge pump triggered upon programming or erasing was needed in the same circuit to generate a high voltage to apply or erase a trapped charge onto or from a floating gate of an EEPROM cell. For a given voltage level, a programming time period is required that is needed to store and erase the charge from the floating gate. Over an array of memory cells this programming time can become significant causing other circuits to wait which delayed the return to functionality of a system.

To reduce the programming time of an array of non-volatile programmable memory cells, it is desirable to program as many EEPROM cells in parallel together as possible. However, there is a limit to the current that can be supplied by a given charge pump. Because programming the EEPROM cell requires a relatively high programming voltage and current to form the trapped charge, the available charge pump current limits how many cells can be programmed in parallel together.

It is desirable to reduce the programming time of an array of non-volatile programmable memory cells and more efficiently program an integrated circuit containing non-volatile programmable memory cells.

BRIEF DESCRIPTION OF THE DRAWINGS

FIG. 5B illustrates a truth table for the operation of each bit calculator of the ripple bit calculator of FIGS. 4A–4B.

FIG. 5C illustrates a truth table for the operation of each bit slice of the ripple bit calculator of FIGS. 4A–4B.

FIG. 5E illustrates a truth table for the operation of the parallel program controller of FIG. 5D.

DETAILED DESCRIPTION

Figure 1A:
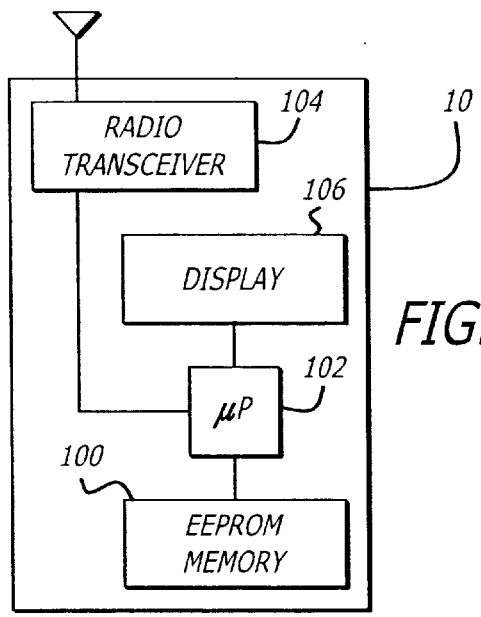
FIG. 1A illustrates a block diagram of a cellular telephone including an EEPROM memory in which the present invention is utilized.

In the following detailed description of the present invention, numerous specific details are set forth in order to provide a thorough understanding of the present invention. However, it will be obvious to one skilled in the art that the present invention may be practiced without these specific details. In other instances well known methods, procedures, components, and circuits have not been described in detail so as not to unnecessarily obscure aspects of the present invention.

The expediency of programming an array of memory cells is particularly important in flash memory devices. How fast the programming algorithm performs the programming is one of the most critical performance specifications in a flash memory device. In programming the EEPROM cells of an array, the entire word is analyzed together at substantially the same time to determine which EEPROM cells (i.e. bits) need programming to a different logical state of zero or one. The number of cells (i.e. bits) to be programmed in parallel together is selectable. Depending upon the charge pump capability, more or fewer cells can be programmed in parallel together at once. The present invention selectively allows efficient parallel programming of one or more bits together in a word of a flash memory or other non-volatile memory device.

In sequencing through the bits of the word that need programming, those that do not need programming which are to remain in the same state are skipped. The bits of the program word are sequenced through in the programming algorithm based on what bits need programming without looking at groupings of bits. That is, the present invention searches out the bits in the word that need to be programmed and those bits that need programming are programmed together responsive to the selection of how many to program together in one cycle.

The present invention operates in a ripple fashion. In essence the present invention counts the number of bits that need programming for the given word that are to be programmed. The number of bits selected for programming is less than or equal to the setting of the maximum number of bits allowed to be program pulsed in parallel together. The bits selected for programming in parallel are output to the programming circuitry. After the program pulse has programmed the currently selected set of bits, a next set of bits to program is calculated, and the prior bits for which the calculation or programming have been performed are disabled and masked out from any further calculation. The present invention continues to determine which bits remain that need programming and programs them until no additional bits in the given word are left to program. The present invention includes logic to detect when all the bits of the given word have been programmed. The present invention further includes a "verify" function to check to see if the programming of the non-volatile memory cells for a given word was successful. If it is successful, then the programming of the word is complete. If the programming was not successful, then the failed-to-program bit(s) in the word are determined and the method of the programming bit sequencer of the present invention is invoked once again to program the failed-to program bit(s).

Figure 1B:
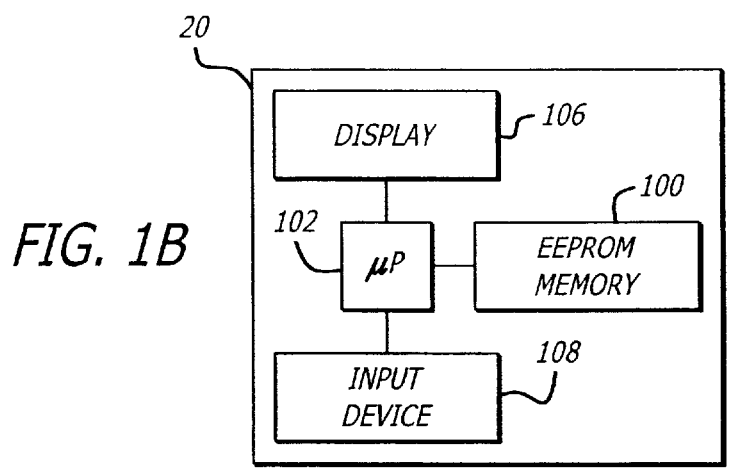
FIG. 1B illustrates a block diagram of a personal digital assistant including an EEPROM memory in which the present invention is utilized.
Figure 1C:
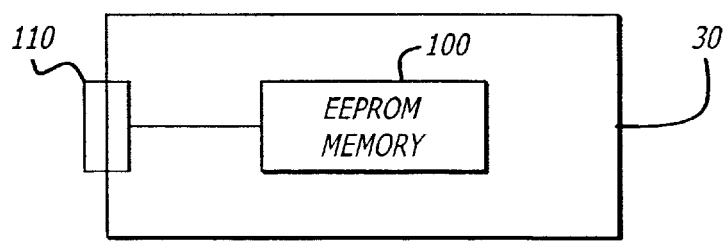
FIG. 1C illustrates a block diagram of a memory card including an EEPROM memory in which the present invention is utilized.

Referring now to FIGS. 1A, 1B and 1C, exemplary electronic devices incorporating the present invention are illustrated. In FIG. 1A, a block diagram of a cellular telephone 10 incorporating the present invention is illustrated. Cellular telephone 10 includes an electrically erasable programmable read only memory (EEPROM) 100 which includes the present invention, a micro processor 102, a radio transceiver 104, and a display 106. The EEPROM memory 100 in the cellular telephone 10 is used to hold programs and other functions of the cellular telephone as well as store user storable information such as telephone numbers which are stored as bits of memory. The bits of memory are represented by a logical one or a logical zero state. A program word is a chunk of bits that are stored in parallel into the EEPROM memory 100. A read out word is a chunk of bits that are read out in parallel from the EEPROM memory 100. The advantage of using the EEPROM memory 100 is that once power is turned off, the bits of the program words stored within the EEPROM are not lost.

In FIG. 1B, a block diagram of a personal digital assistant (PDA) 20 incorporating the present invention is illustrated. The PDA 20 includes the EEPROM memory 100 which includes the present invention, the micro-processor 102, the display 106, and an input device 108.

Referring now to FIG. 1C, a block diagram of a memory card 30 incorporating the present invention is illustrated. Memory card 30 includes the EEPROM memory 100 and a connector 110. The EEPROM memory 100 may be a flash EEPROM or other nonvolatile memory device (e.g. flash NAND, flash NOR, and flash EPROM) which includes the present invention.

The EEPROM memory 100 may be formed and manufactured using MOS technology, CMOS technology, BICMOS technology, or other known semiconductor manufacturing technologies having a nonvolatile method of storing a trapped charge.

Figure 2:
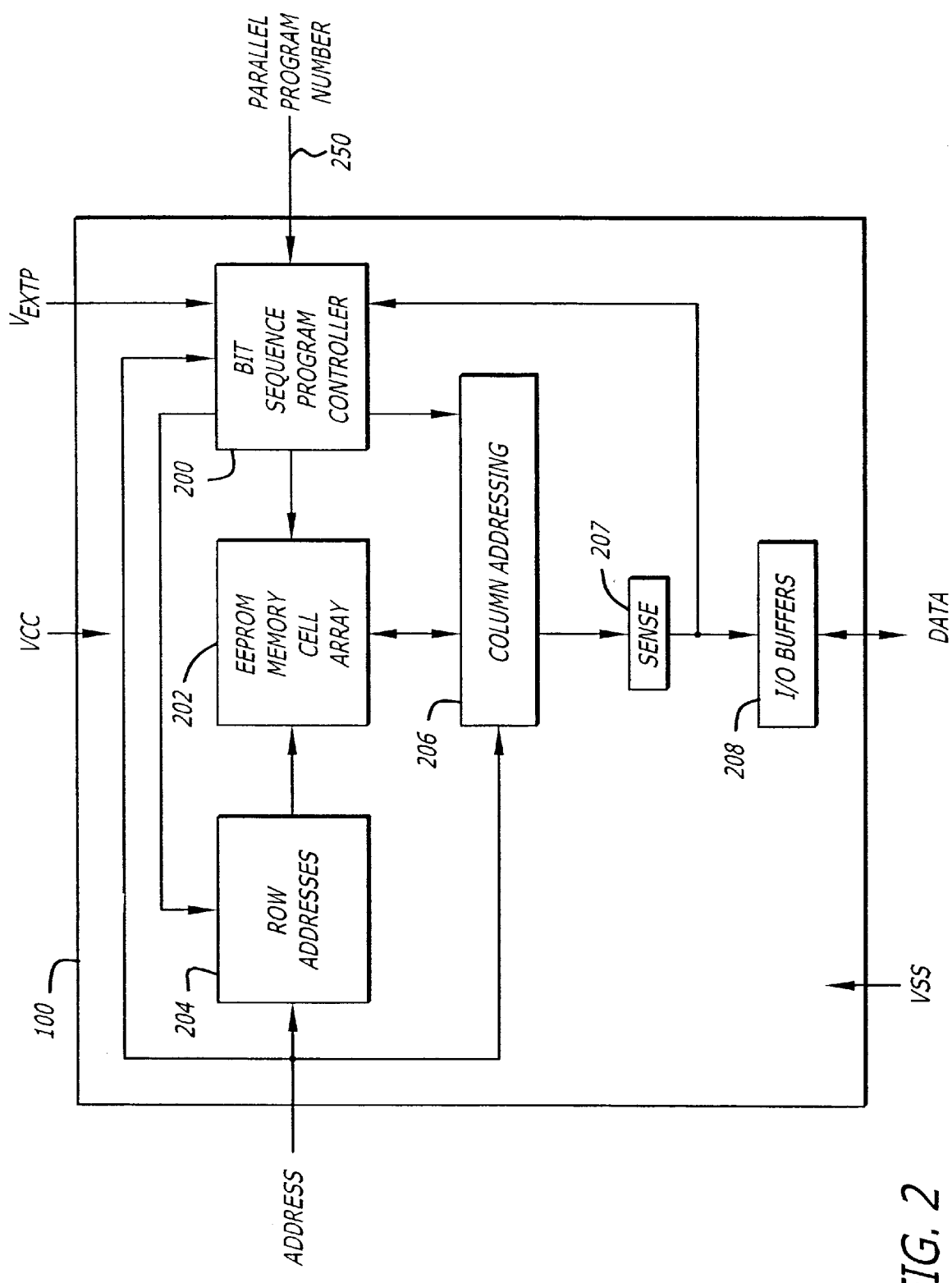
FIG. 2 illustrates a block diagram of an EEPROM memory of the present invention.

Referring now to FIG. 2, a block diagram of the EEPROM memory 100 is illustrated. EEPROM memory 100 receives addresses on an address bus and transceives data on the data bus. The EEPROM memory 100 includes a bit sequence programming controller 200, an EEPROM memory cell array 202, row address decoder 204, column address decoder 206, sense amplifier circuitry 207, and input/output buffers 208. The row address decoder 204 and the column address decoder 206 receive addresses from the address bus or the bit sequence programming controller 200 to generate an address for the selection of a word of cells in the EEPROM memory cell array 202. The generated address may be used to read a word of data out from the EEPROM memory cell array 202 through the sense amplifier circuitry 207 or to program a word of data into the EEPROM memory cell array 202 through the bit sequence programming controller 200. In the case of programming the EEPROM memory cell array 202, the bit sequence programming controller 200 executes the programming bit sequence of the present invention. Input/output buffers 208 of the EEPROM memory 100, receive a word of data from the external data bus which is coupled into the bit sequence programming controller 200 for programming into the EEPROM memory cell array 202. In the case of reading data from the EEPROM memory 100, the input/output buffers 208 write a data word out onto the external data bus.

The bit sequence programming controller 200 receives control lines to selectively configure how many bits are to be programmed in parallel together. Additional control lines are also provided to the EEPROM memory 100 such as interrupts and output enable signals. One particular set of control signals of interest are the parallel program load number control signals 250 which control how many EEPROM cells of a program word are to be programmed in parallel together.

The EEPROM memory 100 also receives a positive power supply input VCC and a negative or ground power supply input VSS. Optionally, the EEPROM memory 100 receives an external programming voltage VEXTP to bypass the generation of an internal programming voltage by a charge pump from VCC. Because VCC is oftentimes a low voltage, the amount of charge that can be generated by an internal charge pump is limited. A user can provide a higher programming voltage with greater current capability externally through the VEXTP input in order to program more EEPROM cells in parallel together.

Figure 3A:
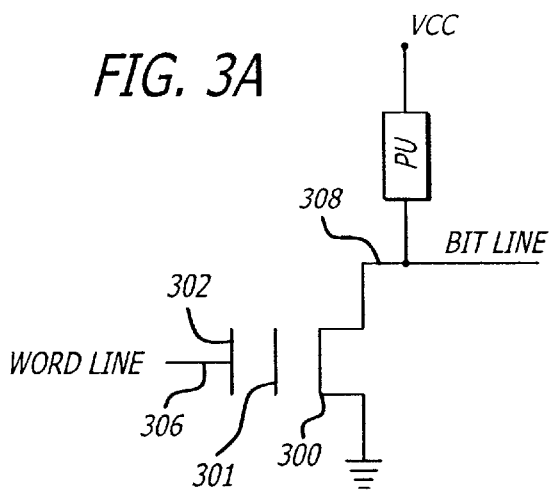
FIG. 3A illustrates a typical transistor schematic symbol of one EEPROM memory cell in the array of EEPROM memory cells of FIG. 2.

Referring now to FIG. 3A, a typical transistor schematic symbol for one EEPROM memory cell is illustrated. The EEPROM memory cell consist of an EEPROM transistor 300 which includes a floating gate 301 which is used to trap a stored charge. The EEPROM transistor 300 further includes a control gate 302 which is coupled to the address line 306. The source of transistor 300 is coupled to ground while its drain is coupled to the bit line 308. A pull-up PU, such as a pull-up resistor, pull-up transistor or clocked precharge pull-up transistor, coupled to VCC may be used to initially pull up the bit line 308 to a logical high level.

Storing of a trapped charge onto the floating gate 301 adjusts the threshold of the EEPROM transistor 300 so it does not turn on when addressed on the control gate 302. Thus, a high level (logical one) which is previously set on a bit line 308 is not discharged to ground with the EEPROM transistor 300 unable to turn on when addressed via the address line 306. By removing the trapped charge from the floating gate 301, the EEPROM transistor 300 can turn on when addressed on the control gate 302 by the address line 306. When the EEPROM transistor 300 is addressed, the control gate 302 is at a high level and turns on the EEPROM transistor 300 such that a high level previously set on the bit line 308 is discharged through ground generating a low level or logical zero. The EEPROM transistor 300 is referred to as being in an erased state when no charge is trapped onto its floating gate.

Figure 3C:
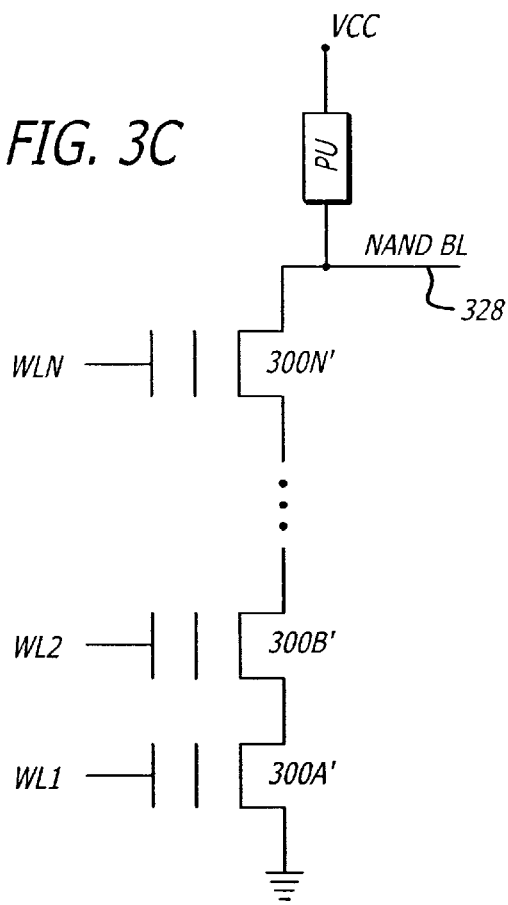
FIG. 3C illustrates N EEPROM transistors coupled in series together to provide a programmable NAND gate.
Figure 3B:
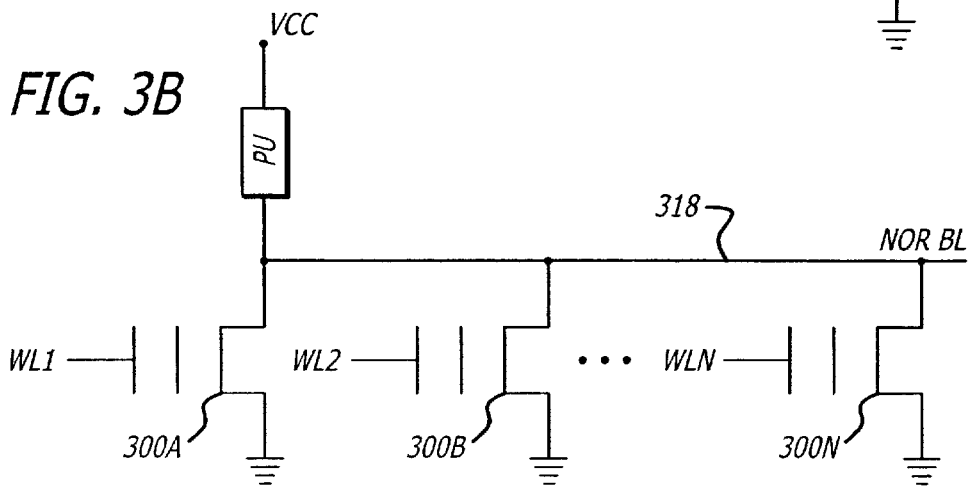
FIG. 3B illustrates N EEPROM transistors coupled in parallel together to provide a programmable NOR gate.

Referring to FIG. 3B, N EEPROM transistors 300A–300N are coupled in parallel together to provide a programmable logical NOR operation of the N word line inputs WL1–WLN. The output of the logical NOR operation is generated on the NOR bitline (NOR BL) 318. The parallel N EEPROM transistors 300A–300N operate similar to EEPROM cells for an EEPROM memory but the pull-up device PU may also include EEPROM transistors that are programmed to act as pull up devices or not. Only one of the EEPROM transistors 300A–300N need be programmed and addressed by WL1–WLN signals in order to pull the NOR BL 318 to a logical low level.

Referring now to FIG. 3C, N EEPROM transistors 300A'–300N' are coupled in series together between ground or VSS and the NAND bitline (NAND BL) 328 to provide a programmable logical NAND operation of the N word line inputs WL1–WLN. The output of the logical NAND operation is generated on the NAND bitline (NAND BL) 328. All N EEPROM transistors 300A'–300N' need to be programmed so as to operate and each addressed by WL1–WLN signals in order to pull the NAND BL 328 to a logical low level. Alternatively, the NAND or NOR operation may be provided by appropriate EEPROM transistors coupled between the bitline and the power supply VCC while a pull down device is used to pre-discharge the bitline NAND BL or NOR BL.

Figure 4A:
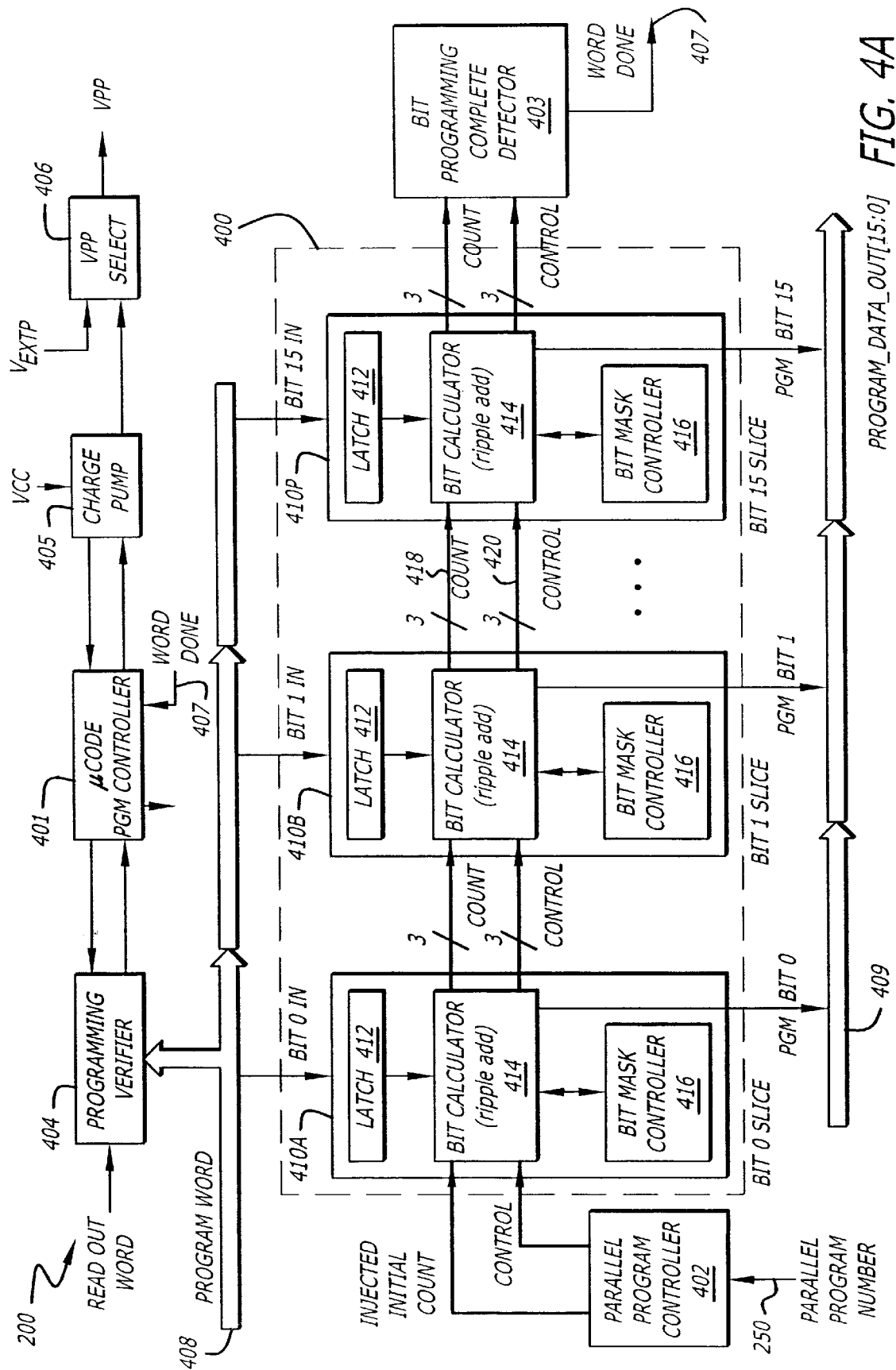
FIG. 4A illustrates a functional block diagram of one embodiment of the bit sequencing programming controller of the EEPROM memory of the present invention.

Referring now to FIG. 4A, a functional block diagram of one embodiment of the bit sequence programming controller 200 is illustrated. The bit sequence programming controller 200 includes a ripple bit calculator 400, a micro code program controller 401, a parallel program controller 402, a bit programming complete detector 403, a programming verifier 404, a charge pump 405, and a programming voltage selector (VPP Select) 406. While the address on the address bus of the EEPROM memory 100 points to the word of EEPROM memory cells for programming, the ripple bit calculator 400 selects the bits within the word which are to be programmed. The ripple bit calculator 400 receives the bits of the program word which is to be programmed into the EEPROM memory cells from the program word data bus 408.

To initially determine which bits of the program word are to be programmed, the ripple bit calculator 400 compares the bits of the program word with the current state of the EEPROM cells. In the preferred embodiment, the current state of the EEPROM cells is the erased state of a flash memory device. Thus, the ripple bit calculator 400 initially compares the entire given program word against a known predetermined erased state to determine which bits of EEPROM memory cells need to be programmed in order to store the program word. Otherwise, the EEPROM memory cells which are addressed by the address where the program word is to be stored could be first read and compared with the program word to determine which bits need to change. Those bits which are determined to require a change in state and are to be programmed are indicated as such during the programming cycles by the ripple bit calculator 400. Those bits which do not require a change in state, are not programmed and the ripple bit calculator does not indicate that these bits and corresponding EEPROM cells are to be programmed. The ripple bit calculator 400 indicates the bits that require programming and those that do not on the program data out bus 409. The bits that require programming which are indicated on the program data out bus 409, select the memory cells that are to be programmed from those that are pointed to by the row and column decoders in response to an external address. For a given program word width, the number of bits to be programmed in parallel is responsive to the parallel program control 402.

In order to determine those bits which require programming, the ripple bit calculator 400 includes bit slice 410A and bit slices 410B through 410P. Bit slice 410A is the bit slice for bit zero of the program word while bit slice 410P is the bit slice for the last bit of the program word, bit fifteen for a given word width of sixteen bits. If the number of bits in the program word is greater than sixteen bits, additional bit slices can be added to determine the number of bits that need programming.

Each bit slice 410 includes a bit calculator 414 and a bit mask 416. Each bit slice 410 may further include a latch 412. Alternatively, a latch, such as latch 412' in the alternate embodiment the bit sequence programming controller 200' of FIG. 4B, may be used outside the ripple bit calculator 400 to initially store the program word data from the program word data bus 408. Between each bit slice 410, a count signal ripples through the ripple bit calculator 400. The count signal represents the number of bits that need programming from a given point of the ripple bit calculator 400. Each bit slice may add an additional count to the count signal it receives if its bit corresponding to the bit of the program word requires programming. The output count signal from each bit slice is either the received count signal or the received count signal with one additional count. But for the last bit slice, the output count signal from a bit slice is passed onto the next bit slice. Additionally, control signals 420 propagate through and are coupled to each bit slice 410A–410P. The control signals 420 include a signal to reset each bit mask 416 and a program signal that essentially clocks the sequence of the bits that require programming.

Assuming that not all bits of the program word can be programmed in parallel together, such as when the charge pump 405 is used to generate the programming voltage VPP from a low voltage supplied as VCC, the bits of the program word are programmed in a sequence. The sequence of programming is responsive to the bit positions requiring programming and the parallel program number. The parallel program number is an input signal provided to the parallel program controller 402. The ripple bit calculator 400 determines which bits of the program word require programming into the addressed word of EEPROM memory cells. EEPROM memory cells, which already indicate the logical state of a corresponding bit of the program word, do not need to be programmed. As the bits are programmed in the ordered sequence, the count signals, representing the number of bits that require programming from one stage to the next, may be reduced. After each programming cycle for a given number of bits of the program word, the bit mask control 416 masks out those given bits in the corresponding bit slices 410A–410P which had their bits programmed. After having a given bit or bits masked out, the ripple bit calculator can not indicate that the respectively masked out bits require programming again until the bit mask control 416 of each slice is reset. The mask control 416 also removes a bit of the program word from the determination of the count signal by the ripple bit calculator 400, allowing higher order bits (or lower order bits depending upon the sequencing order) to be considered for programming and indicated as such by the ripple bit calculator 400. The masking essentially reduces the count signal that ripples through the ripple bit calculator 400.

The parallel program controller 402 receives a parallel program number input signal 250 which selects the number of bits to be programmed in parallel together. The parallel program number input signal 250 into the parallel program control 402 is factory selectable in most cases and is selected based on the design of the array including the bit width of a word and the current requirements for programming a given EEPROM cell. The functional performance and design of the charge pump, including how much current it can provide, is also a consideration. In other cases, such as where a user may trade off power consumption for speed in programming performance, the parallel program number input signal into the parallel program control 402 may be selectable by a user. Furthermore, if an external programming voltage VEXTP of a high enough voltage level and current is provided, the parallel program number 250 may be selected to a high value so that a large number of bits, such as sixteen bits, can all be programmed in parallel together. When the EEPROM cells are programmed in parallel together, the programming voltage VPP is applied to each addressed EEPROM cell at substantially the same time in order to store charge on each of their respective floating gates. The programming voltage selector (VPP select) 406 receives the output from the charge pump 405 and the external programming voltage VEXTP. Typically, VCC is a low voltage that needs to be increased to a higher voltage level by the charge pump 405 in order to program the EEPROM memory cells. If a sufficiently high voltage level is available on the external programming voltage input VEXTP, it is preferable to use this source for the programming voltage. The programming voltage selector 406 automatically senses the external programming voltage input VEXTP and determines whether or not it is of a sufficient voltage level to be used as the programming voltage. If so, the programming voltage selector 406 selects VEXTP as the programming voltage source and disables the charge pump 405.

The parallel program controller 402 can function in a number of different ways to control the parallel programming of bits. One way is to inject an initial count signal into the ripple bit calculator 400. The injected initial count signal reduces the number of bits which the ripple bit calculator 400 can indicate can be programmed in parallel together. For example, assume that it is desirable to program only one bit at a time. The parallel program number input signal 250 is set to a value of one. In response to this setting of the parallel program number input signal, the parallel program controller 402 injects a count of three into the first bit slice of the ripple bit counter as the initial count signal. With a given maximum number of four bits which can be programmed in parallel together, the ripple bit calculator 400 can only indicate one bit at a time which can be programmed because the three out of the four maximum programming bits has been taken away by the injected initial count signal. The injected initial count signal ripples through each bit slice of the ripple bit calculator 400 as a base count value. Each bit slice can add one to the base count value, in sequence, for those bits requiring programming.

The final count signal is output from the last bit slice of the ripple bit calculator 400 and counted by the bit programming complete detector 403. When the final count signal indicates that there are no more further bits to program, the bit programming complete detector 403 generates a word done signal 407. The word done signal 407 is coupled into the micro code program controller 401 so that the next step in programming can be performed. In order to perform the comparison, the bit programming complete detector 403 receives the injected initial count value from the parallel program controller 402 and the final count signal from the last bit slice of the ripple bit calculator. If the bits that needed programming in the program word have been completed, they are masked out at each stage such that the final count signal should be identical to the injected initial count value. That is, no bit slice should add to the injected initial count value when all the bits requiring programming have been programmed. Therefore, the injected initial count value should ripple completely through the ripple bit calculator 400. If the comparison performed by the bit programming complete detector 403 between the final count signal and the injected initial count signal determines that they match, bit programming is complete and the word done signal is generated. If they do not match, the word done signal is not generated and further programming of bits is required.

After the generation of the word done signal 407, the programming verifier 404 is provided with the read out word from the EEPROM memory cells and the program word which was to be programmed. The programming verifier 404 compares the bits of the read out word from the EEPROM memory cells with the bits of the program word. Each bit of the program word is stored in each latch 412 of each corresponding bit slice 410A–410P of the ripple calculator 400. If the programming verifier 404 determines that there is a match between a bit of the program word and the value stored in the corresponding EEPROM memory cell, the latch 412 corresponding to that bit is cleared to indicate that the programming is completed for that given bit. If the programming verifier 404 determines that there is a match between all bits of the program word and all the bit values stored into the EEPROM memory cells, then the programming of the given word is completed. If not, the programming verifier 404 signals to the micro code program controller 401 to restart the programming cycle using the updated values in each latch 412 of each bit slice 410A–410P to reprogram only those bits that need programming.

The micro code program controller 401 controls the sequence of programming steps performed by the bit sequence programming controller 200. The micro code program controller 401 includes a micro coded program and control logic to sequence through the programming steps of the micro coded program. The micro code program controller 401 generates control signals that are coupled to functional blocks of the EEPROM memory 100 including the programming verifier 404, the ripple bit calculator 400, the parallel program controller 402, the bit programming complete detector 403 and the charge pump 405 of the bit sequence programming controller 200. The micro code program controller 401 also receives control signals from the functional blocks of the EEPROM memory 100 including the programming verifier 404, the charge pump 405 and the bit programming complete detector 403 of the bit sequence programming controller 200. The word done signal 407 from the bit programming complete detector 403 indicates to the micro code program controller 401 that verification of the bit programming of the program word can begin. Control signals from the programming verifier 404 to the micro code program controller 401 include those that indicate whether or not programming can begin for the next program word or whether or not the program word which just underwent a programming cycle needs additional programming to verify reliably.

The charge pump 405 generates program pulse voltages which are coupled into program voltage selector VPP select 406 in response to receiving a control signal from the micro code program controller 401 if an external program voltage VEXTP is not provided. While the address points to the word of EEPROM memory cells for programming, the ripple bit calculator 400 selects the bits within the word which are to be programmed. Those bits within the word which are indicated by the ripple bit calculator 400 to be programmed have program pulse voltages VPP, generated by the charge pump 405 or the external program voltage source VEXTP, selectively applied to their respective EEPROM memory cells in order to store a charge on their floating gates.

Figure 4B:
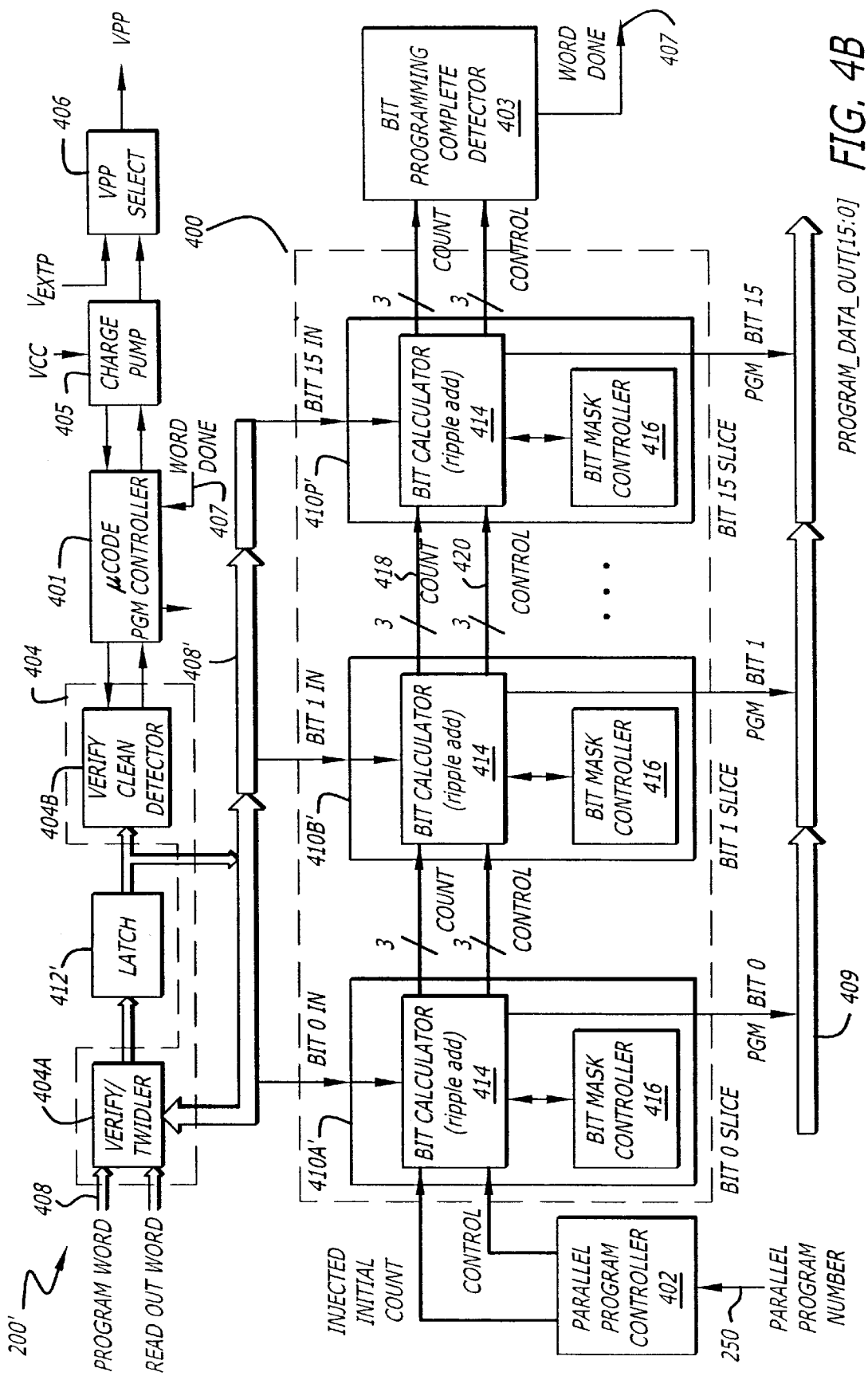
FIG. 4B illustrates a functional block diagram of another embodiment of the bit sequencing programming controller of the EEPROM memory of the present invention.

Referring now to FIG. 4B, a functional block diagram of the bit sequence programming controller 200' is illustrated. The bit sequence programming controller 200' is a preferred embodiment with each latch 412 removed from each bit slice 410 and replaced by one latch 412' that latches all bits of the program word therein together. With the latch 412' in the bit sequencing programming controller 200', the programming verifier 404 includes a verify twiddler 404A and a verify clean detector 404B.

Initially when a new program word is presented for programming, the program word on the program data bus 408 is coupled into the latch 412' through the verify twiddler 404A. In an alternate embodiment, the memory locations may be read out and an initial comparison made between the read out word and the program word by the verify twiddler 404A to determine what bits need programming and which do not. With all bits of the program word stored into the latch 412', the bits of the program word are coupled into the respective bit slice 410A'–410P' of the ripple bit calculator 400, the verify clean detector 404B and fed back into the verify twiddler 404A from data bus 408'.

After the programming cycle for a given program word is completed, the EEPROM memory cells where bits of the program word are stored are read out and coupled into the verify twiddler 404A as the read out word. The bits of the program word on the data bus 408' which are stored in the latch 412' are compared with the read out word by the verify twiddler 404A. The verify twiddler 404A, as a result of the comparison, changes those bits which match to a logical state (logical ones in this case) to indicate that those bits were stored properly and do not need further programming. Those bits that were not stored properly, are not changed by the verify twiddler 404A and hold the logical state indicating that they need to be programmed. This comparison is latched into latch 412'. The verify clean detector 404B, analyzes all bits of the data bus 408' to determine if any programming is initially required and to determine if any additional programming is needed after a programming cycle has been completed. The verify clean detector 404B signals to the micro-code program controller 401 when all bits of a given program word have actually been properly stored into EEPROM cells of the EEPROM memory cell array 202. In the case that a logical zero indicates that a bit on the data bus 408' requires programming, the verify clean detector 404B logically ANDs all bits of the data bus 408' together to determine if they are all logical ones to indicate a pass condition. If any one of the bits of the data bus 408' indicates a logical zero condition, the verify clean detector indicates a fail condition.

Otherwise, the bit sequence programming controller 200' is similar to the bit sequence programming controller 200. The bit sequence programming controller 200' otherwise operates similarly and contains the same functional blocks, elements and control logic of the bit sequence programming controller 200.

The detailed description of FIGS. 5A–5F that follows is for an exemplary embodiment of the EEPROM memory 100. It is assumed that the EEPROM memory 100 is a flash memory which has an array of EEPROM cells which is fully erased before any programming occurs. Alternatively, the program word that is to be programmed, need only have the addressed EEPROM cells erased first before programming. While the erased state can logically be a logical zero (a low state output) or a logical one (a high state output) with the appropriate number of inversions, the following description assumes that each EEPROM cell is erased to have a logical one state before programming. During programming of the EEPROM memory, the erased state of logical one is converted into a programmed state of logical zero. Thus, bits of the program word on the program word data bus 408 which require programming are indicated by a logical zero. Therefore, the bit calculator 414 of each bit slice 410, determines how many zeros are in the bits of the given program word. Alternatively with the erased state being a logical zero, the bit calculator 414 of each bit slice 410 would determine how many ones are in the bits of a given program word.

Furthermore, the charge pump 405 of the present embodiment can program up to four bits in parallel together. Therefore, the count signal between each bits slice of the ripple bit calculator indicates a maximum count value of four. For a charge pump 405 that can program N bits in parallel together, the logic of the ripple bit calculator 400 can be altered to properly count a signal that can indicate a maximum count value of N for programming N bits in parallel together.

Figure 5A:
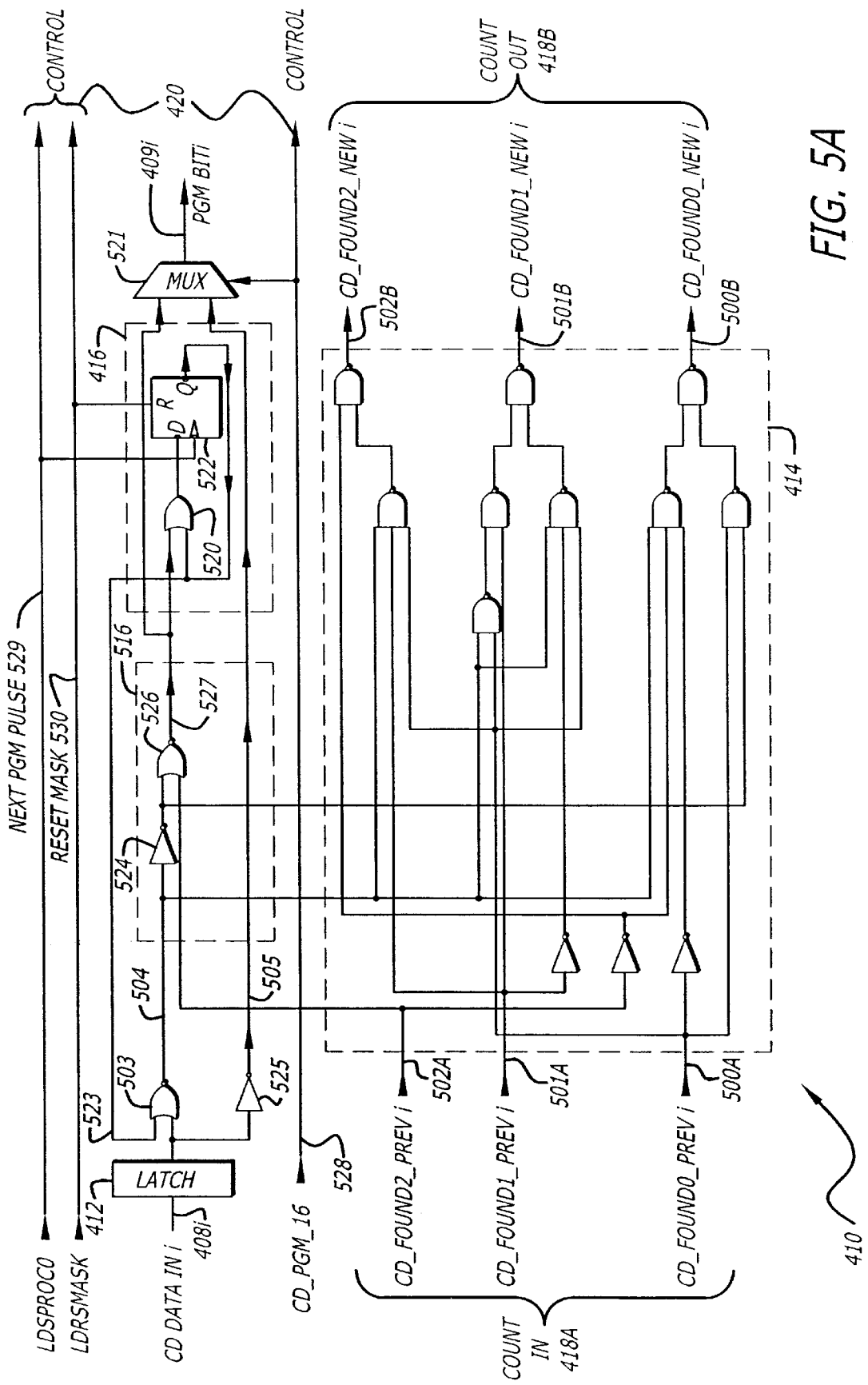
FIG. 5A illustrates a schematic diagram of each bit slice of the ripple bit calculator of FIGS. 4A–4B.

Referring now to FIG. 5A, a detailed schematic diagram of each instance of the bit slice 410 for the ripple bit calculator 400 is illustrated. In the case of the alternate embodiment of FIG. 4B for each bit slice 410', the latch 412 is removed because it is external and the data bit input, CD_Data Ini 408$i$, is coupled directly to NOR gate 503 and inverter 525. But for the latch 412, each bit slice 410 or 410' of the ripple bit calculator 400 includes the logic as shown and coupled together in FIG. 5A. The bit calculator 414 includes random logic to perform a ripple bit add of the ripple count input value (count in 418A) and a bit of the program word to generate the ripple count output value (count out 418B). Referring momentarily to FIG. 5C, a truth table for the operation of each bit calculator 414 of each bit slice 410 is illustrated.

Referring now to FIG. 5B, an encoding table shows the relationship between a code of the count signals and the number of zeroes counted in the program word. Assume for example that the output count signal represented by CD FOUND bit zero 500B, CD FOUND bit one 501B and CD FOUND bit two 502B is zero-zero-zero respectively. In this case no zeros have been encountered from previous bit slices nor is a zero generated by the given bit slice from its respective bit. That is, no zeroes have been found which require programming in the sequence of bits through the given bit slice. If the CD FOUND bits 502B, 501B and 500B are respectively zero-zero-one, then one zero may have been found either in a prior bit slice or a zero is detected at this given bit slice from its corresponding bit of the program word. That is, one zero may have been found which may require programming in the sequence of bits through the given bit slice. If the respective CD FOUND bits 502B, 501B, and 500B are zero-one-zero respectively, then two zeros may have been found which may require programming in the sequence of bits through the given bit slice. If the respective CD FOUND bits 502B, 501B and 500B are respectively zero-one-one, then three zeros may have been found which may require programming in the sequence of bits through the given bit slice. If CD FOUND bits 502B, 501B and 500B are respectively one-zero-zero, then four zeros may have been found which may require programming in the sequence of bits through the given bit slice. In the disclosed embodiment, the control logic of the bit calculator 414 supports counting up to four zeros. The encoding of CD found bits 502B, 501B, and 500B for five, six and seven zeros is reserved for future expansion and will not occur in the disclosed embodiment.

For example, assume that the given bit slice is bit slice three which receives bit three of the program word and the count signal from the preceding bit slice. Assume further that the number to program in parallel is four and that the count signal output from bit slice two is one-zero-zero. Assume further that bit 3 of the program word is a zero such that CD DATA IN 408i is a zero which generates a logical high on CDLAT 504. Bit slice three of the ripple bit calculator 400 generates a logical one on the program bit output signal PGMBIT 409i.

A logical one on PGMBIT 409i indicates that the corresponding EEPROM cell of the addressed location to store the program word requires programming to a logical zero state from a logical one state. After the corresponding EEPROM cell is programmed, the bit of the program word is masked out so the ripple bit calculator 400 does not indicate any further that it needs programming and that it is no longer considered in the ripple bit calculations in generating the count signal.

The bit calculator 414 of the bit slice 410 uses random logic to generate the count signal. The bit calculator 414 receives the count in signal 418A and adds one count if the corresponding bit of the program word requires programming to generate the count out signal 418B. If the corresponding bit of the program word does not require programming, the count in signal 418A is merely passed to the count out signal 418B. The functionality of the random logic of the bit calculator 414 is illustrated in the truth table of FIG. 5C. The truth table of FIG. 5C has as an input the cd found previous values 500A–502A and the CDLAT values 504 and generates the corresponding values of the cd found values 500B–502B and PGMBITi signal 409i.

For example, if the given bit 408i of the program word on the program word data bus 408 is a logical zero and has not already been programmed, OR gate 503 indicates a high output on cdlat signal 504. If the given bit 408i of the program word on the program word data bus 408 is a logical one which does not require programming, OR gate 503 indicates a low output on cdlat signal 504. Cdlat signal 504 is coupled into the bit calculator 414 and if it is a logical one, it increases the count signal input 418A by one in order to generate the count output 418B. If cdlat signal 504 is a zero, then there is no change from the input count in 418A to the count output 418B. If the cdlat signal 504 is a one indicating that the zero count value needs to increased, then the count out value 418B increases by one as illustrated in FIG. 5C up to a maximum indicated value of 4 zeros being found. In the case that the count in value 418 is already four zeros and the cdlat signal 504 is a one indicating that an additional zero needs programming, the additional zero for programming is not reflected in the count out 418B. In this case the count out 418B continues to indicate that four zeros have been found which need programming.

Given that a maximum number of four bits can be programmed in parallel, if cd found2 previous 502A indicates that four zeros have been previously been found that require programming, the corresponding bits of the given bit slice and subsequent bit slices will not be programmed until a reduction in the count value of the count in 418A occurs. Assuming that the count value is four and cd found2 previous 502A indicates four, once programming has occurred the count in value 418A will be reduced. If the parallel programming number is one, then the count in value 418A will be reduced by one when programming occurs. If the parallel programming number is two, then the count in value 418A will be reduced by two after programming occurs. If the parallel programming number is three, then the count in value 418A will be reduced by three after programming. If the parallel programming number is four, then the count in value 418A will be reduced accordingly by four after programming. After programming one or more bits, it is desirable to mask out the bits which have been programmed in order for them to avoid being considered in the higher order counting of the ripple bit calculator 400. In order to do so, each bit slice 410 includes bit mask control logic 416. The bit mask control logic 416 operates in conjunction with the latch 412, new program load generator 516, NOR gate 503, inverter 525 and multiplexer 521. The bit mask control logic 416 includes an OR gate 520 and a latch 522. The new program load generator 516 includes an inverter 524 and a NOR gate 526. The control signals 420, including the parallel program control signal CD_PGM_16 528, the next program pulse signal (LDSPROGO) 529, and Reset Mask (LDRSMASK) 530, are provided to each bit slice 410. The parallel program control signal CD_PGM_16 528 controls the selection of multiplexer 521 and the next program pulse signal LDSPROGO 529 and Reset Mask LDRSMASK 530 control latch 522 in each bit slice 410.

NOR gate 526 receives as an input the cd found2 previous signal 502A. If cd found2 previous signal 502A is a logical one representing a count value of four zeros being found in previous sections, the load output 527 of NOR gate 526 is a logical zero. This indicates that the bit represented by this given bit slice 410 is not to be programmed until a reduction in the value of count in 418A occurs. In this case, the output of latch 522 which is initially set to zero, is input into OR gate 520. The load output 527 is also input into the OR gate 520. With both the load output 527 and the CD MASK output from latch 522 being logical zeroes, the output of OR gate 520 is a logical zero. The output of OR gate 520 is coupled as the input into the latch 522. If latch 522 is strobed by the next program pulse signal (LDSPROGO) 529 with the output of OR gate 520 being zero, then a zero is latched into latch 522.

For example, assume that the count in value 418 is less than four zeros such that cd found2 previous 502A is a zero, four bits are to be programmed in parallel together, and the corresponding bit of the bit slice is a zero, then the given bit slice is to indicate that its corresponding bit is to be programmed on the next programming cycle. In this case, CD Data in 408i is a logical zero, CD MASK is a logical zero, CDLAT 504 is a logical one, CDLATB is a logical zero, CD FOUND2 previous 502A is a logical zero, load out 527 is a logical one that propagates through OR gate 520 and is coupled into the data input of latch 522. The next program pulse LDSPROGO 529 is coupled into the clock input of latch 522. Upon the next program pulse LDSPROGO 529 being pulsed to indicate a programming cycle, the corresponding bit is programmed and the logical one from the OR gate 520 is latched into latch 522. The output of latch 522, CD MASK 523, is now a high level or logical one such that the output CDLAT 504 of NOR gate 503 is a logical zero or low level. With CDLAT 504 set to a logical zero, the value of the count in signal 418A is not increased by the given bit slice. The corresponding bit of the given bit slice is thus not included in the count of the bit calculator 414 and the count in signal 418A ripples through as the count out value 418B.

Figure 5D:
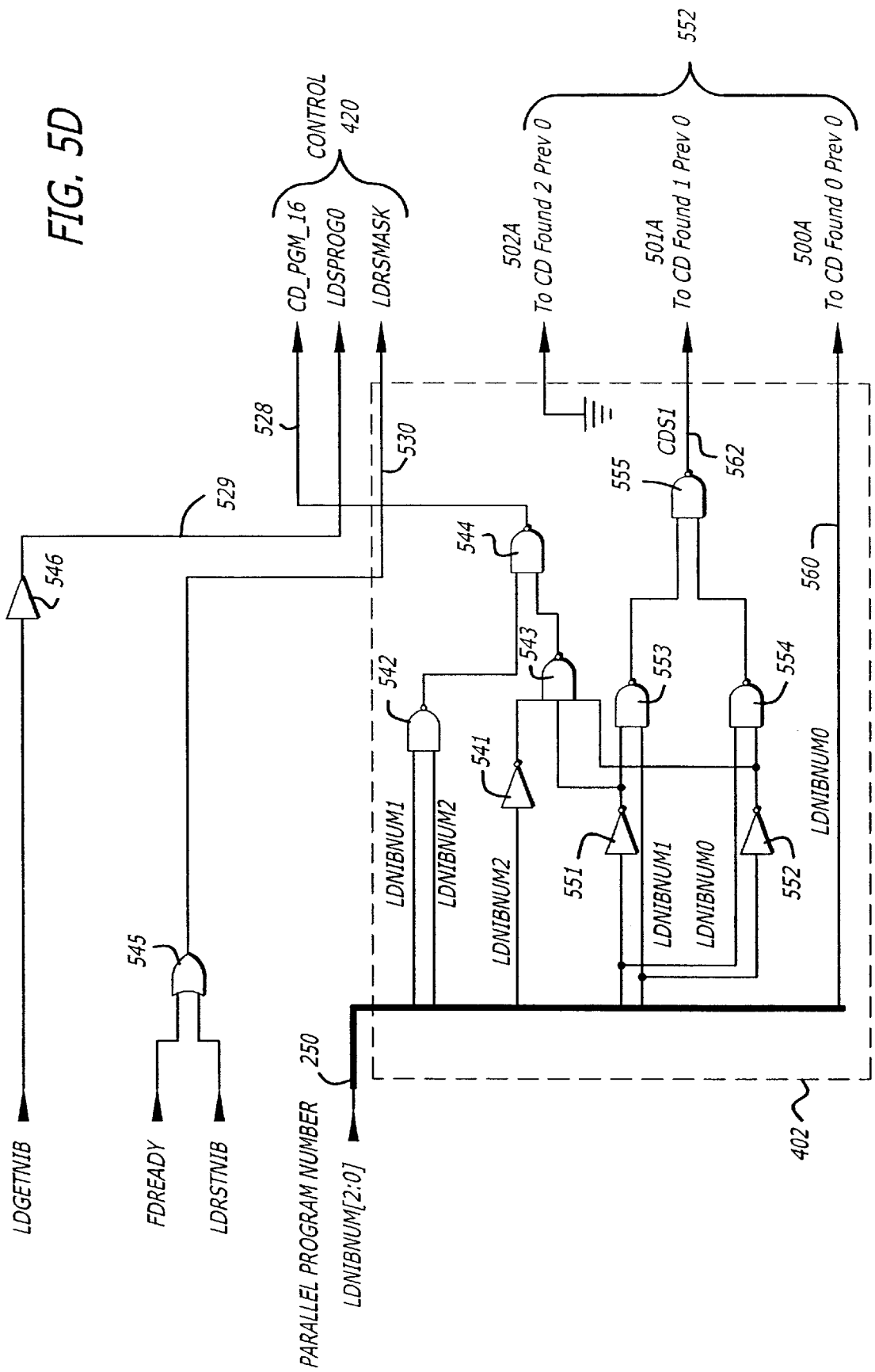
FIG. 5D illustrates a schematic diagram of the parallel program controller block of FIGS. 4A–4B.

Referring now to FIG. 5D, a schematic diagram of the parallel program controller 402 is illustrated. The parallel program controller 402 receives a parallel load number 250 and provides the control signals LDNIBNUM0 560, and CDS1 562 at its output to provide an initial zero count value into the first bit slice 410A. Also illustrated in FIG. 5D is how the control signals 420, including the parallel program control signal CD_PGM_16 528, the next program pulse signal LDSPROGO 529, and Reset Mask LDRSMASK 530, are generated for each bit slice 410.

The parallel load number 250 as previously discussed is typically selected in response to the design and performance of the charge pump 405 and the EEPROM memory cells. The random logic of the parallel program controller 402 is shown and coupled together as illustrated in FIG. 5D. Referring momentarily to FIG. 5E, a truth table illustrates the generation of the control signal outputs in response to the values of the parallel load number 250 with the parallel load number value 101 being reserved. The output control signals of the parallel program controller 402 are coupled into the count value input 418A of the first bit slice 410A (i.e. bit zero) of the ripple bit counter 400. A logical zero is coupled into CD FOUND2 previous 502A of the first bit slice 410A. The CDS1 output 562 from NAND gate 555 is coupled into the CD FOUND1 previous 501A of the first bit slice 410A. Bit zero of the parallel load number 250, LDNIBNUM0 560, is coupled into the CD FOUND0 previous 500A of the first bit slice 410A. These control outputs 552 of the parallel program controller 402, cause an initial value for the count signal to be injected into the first bit slice of the ripple bit calculator 400. If it is desirable to set the number of bits to be programmed in parallel together to be one, then the bits of the parallel load number are respectively zero-zero-one as shown in FIG. 5E. In this case the values of co found2 previous 502A, co found1 previous 501A, and co found0 previous 500A are one-one-zero respectively. This combination is equivalent to having three zeros requiring programming. Because the maximum count value is four, only one bit is programmed in each programming cycle which can reduce the ripple count value by only one. Therefore, only a single bit is programmed during each program cycle.

If the desired number of bits to be programmed in parallel together is two, then the parallel load number 250 is set so that the code of the count in 418A for the number of zeroes input into the first bit slice 410A corresponds to two. In this case, each program cycle can only reduce the ripple count value by two. If the desired number of bits to be programmed in parallel together is three, then the parallel load number 250 is set so that the code of the count in 418A (cd found2 prev, cd found1 prev, cd found0 prev) for the number of zeros input into the first bit slice 410A corresponds to one. In this case, each programming cycle can reduce the ripple count value by three. If it is desirable to have four bits programmed in parallel together, the parallel load number 250 is set such that the code of the count in 418A for the number of zeros input into the first bit slice 410A is zero. In this case the next program cycle can reduce the ripple count value by its maximum of four. In this manner, a factory or a user can select the number of bits to be programmed in parallel together by the EEPROM memory 100.

In order to generate the initial bit 1 which is injected into the CD found1 previous input 501A, the random logic of inverter 551, inverter 552 and NAND gates 553, 554, and 555 is provided as shown and connected together. The random logic of the inverter 551, inverter 552 and NAND gates 553, 554, and 555 perform an exclusive-or (XOR) function using bit zero and bit one of the parallel load number 250 in order to generate CDS1. CDS1 is coupled into the CD found 1 501A of the first stage. Bit zero of the parallel load number 250 is coupled into the CD found 0 previous input 500A of the first bit slice 410A. A logical zero is coupled into CD found 2 previous input 502A of the first bit slice 410A.

The default number for the desired number of bits to be programmed in parallel together is the maximum, in this case sixteen bits. This corresponds to a parallel load number 250 of zero-zero-zero or 000. Alternatively, the parallel load number can be set to 110 or 111 to program the maximum or sixteen bits in parallel together. If other numbers are desired for the number of bits to be programmed in parallel together, the control logic of the present invention and load number input need simply change accordingly.

In the case of programming the maximum or sixteen bits in parallel together, the setting of the parallel load number to 000, 110, or 111 is input into the control logic formed of inverters 541, 551–552 and NAND gates 542–544 to generate the sixteen bit program control signal (CD_PGM_16) 528. The sixteen bit program control signal CD_PGM_16 528 is coupled into the bit programming complete detector 403 and each bit slice 410A–410P of the ripple bit calculator 400. If the maximum number of bits to be programmed in parallel together is selected, only one programming pulse is used to program all bits that need programming. Upon completion of the one programming cycle, the final ripple count value output 418B from the last bit slice 410P is zero. Thus the sixteen bit program control signal CD_PGM_16 528 when selected, causes the bit programming complete detector 403 to generate the word done signal 407 in the same program pulse. The ripple count value rippling through the ripple bit counter is irrelevant in this case because the program pulse should essentially reduce the ripple count value to zero but for the initial zero count value input. The initial zero count value input is also irrelevant because the sixteen bit program control signal CD_PGM_16 528 when selected, causes all bits of the program word to be evaluated in parallel together for programming.

Referring back to FIG. 5A, the sixteen bit program control signal CD_PGM_16 528 is coupled into the selection control input of multiplexer 521. In the case that less than the maximum bits are to be programmed in parallel together, the load output 527 from the new program load generator is multiplexed out onto PGM Biti 409$i$ through multiplexer 521. In the case that the maximum bits are to be programmed in parallel together, the inverted bit of the program word from inverter 525, CDDATB 505, is multiplexed out onto PGM Biti 409$i$ through multiplexer 521. In this case if the given bit of the program word is a zero, it is inverted to a logical one on the program bit output PGM Biti 409$i$ to indicate that it needs programming. Similarly a logical one in a bit of the program word is inverted into a logical zero. Thus, inversion of bits of the program word indicates what bits need to be programmed in parallel together.

Referring to FIG. 5D, the control signal LDGETNIB from the micro-code program controller 401 is coupled into buffer 546. Control signals FDREADY and LDRSTNIB from the micro-code program controller 401 are coupled into the OR gate 545. The control signal LDGETNIB generates the next program pulse signal LDSPROGO 529 through buffer 546. The output of OR gate 545 is the reset mask signal LDRSMASK 530. The reset mask signal LDRSMASK 530 resets latch 522 while the next program pulse signal LDSPROGO 529 clocks the latch 522 to update it.

Figure 5F:
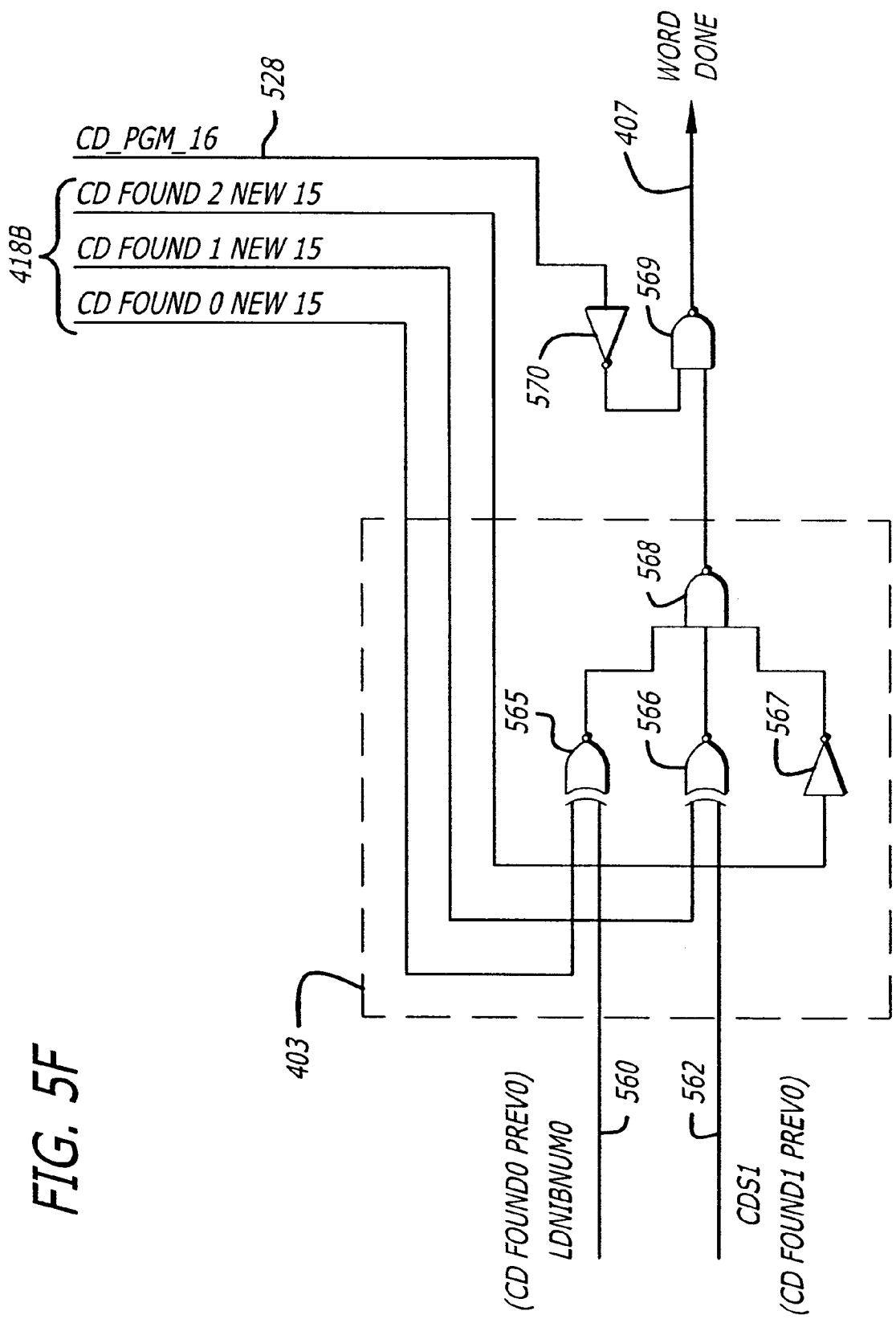
FIG. 5F illustrates a schematic diagram of the bit programming complete detector of FIGS. 4A–4B.

Referring now to FIG. 5F, a schematic diagram of the bit programming complete detector 403 is illustrated. After completing a programming cycle, the bit programming complete detector 403 determines if an attempt has been made to program all bits of the program word which require programming into the corresponding bit positions of the word of EEPROM cells. Because a word may be 16 bits in width and the programming or the EEPROM cells may be performed at a maximum of four bits at a time, the bit programming complete detector 403 is an essential part to determining that programming has been completed. The bit programming complete detector 403 is coupled to the ripple bit calculator 400 to receive the count out signal 418B from the last bit slice 410P. The last bit slice in the preferred embodiment corresponds to bit 15 of the program word. The bit programming complete detector 403 is also coupled to the parallel program controller to receive the initial count value injected into the count in 418A of the first bit slice 410A. The bit programming complete detector receives bit zero (LDNIBNUM0 560) of the parallel load number 250 and the output of NAND gate 555 representing the exclusive OR of bits one (LDNIBNUM1) and zero (LDNIBNUM0 560) of the parallel load number 250.

The bit programming complete detector 403 determines if no further bits remain to be programmed. The bit programming complete detector 403 accomplishes this by comparing the count output 418B of the last bit slice 410P with the injected initial count value set by the parallel load number 250. If the count output 418B from the last bit slice 410P is the same as the injected initial count value set by the parallel load number 250, then there are no other bits that need programming. Random logic as shown and connected in FIG. 5F within the bit programming complete detector 403 can be utilized to perform this comparison.

The exclusive NOR gate 565 of the bit programming complete detector 403, compares bits zero (LDNIBNUM0 560) of the parallel load number 250 with bit zero (CD FOUND0 NEW) of the final count output 418B. The exclusive NOR gate 566 compares the exclusive OR output of bits zero and one of the parallel load number 250 with bit one (CD FOUND1 NEW) of the final count output 418B from the last bit slice 410P. With bit two of the injected count input to the first bit slice 410A being set to zero, inverter 567 need only be used to compare bit two (CD FOUND2 NEW) of the count output 418B of the final bit slice 410P with zero.

Recall that the injected initial count value generated by the parallel program control 402 from the parallel load number 250, ripples through the ripple bit calculator 400. If the final value that ripples through the ripple bit calculator matches the injected initial count value, then bit programming is completed. For example, assuming that the number of bits to be programmed in parallel is one such that the parallel load number is one-zero-zero. The corresponding values of the CD Found previous 418A are one-one-zero respectively such that the injected initial number of zeros input into the first stage is three. Comparing the load number bit zero (LDNIBNUM0 560) which is a logical one with the CD found zero bit which is a logical one, the exclusive NOR gate 565 generates a logical one output. If CD found2 new of the final count output 418B is a logical zero, inverter 567 generates a logical one at its output. If the output CDS1 562 which is coupled into the first bit slice 410A as CD found1 previous 501A is a logical one, and the output from the last stage of the CD found1 new is a logical one, then exclusive OR gate 566 generates a logical one output. With the all outputs from the gates 565, 566 and 567 being a logical one, NAND gate 568 generates a logical zero on its output. The output of NAND gate 568 is coupled into NAND gate 569. A logical zero input into NAND gate 569 generates a logical one as the word done output signal 407. If all outputs from the gates 656, 566, and 567 are not logical ones, NAND gate 569 does not generate the word done output signal 407 and programming of the bits of the program word continue into the EEPROM cells. In this manner a determination can be made whether bits still remain to be programmed from the program word.

The sixteen bit program control signal CD_PGM_16 528 is coupled into inverter 570, inverted, and then coupled into the NAND gate 569. When sixteen bit program control signal CD_PGM_16 528 is a logical one, the word done signal 407 is generated by the NAND gate 569 to indicate that the programming of the given program word was completed in the same program pulse. In this case when the sixteen bit program control signal CD_PGM_16 528 is a logical one, the final ripple count value output from the last bit slice 410P is ignored.

Figure 6:
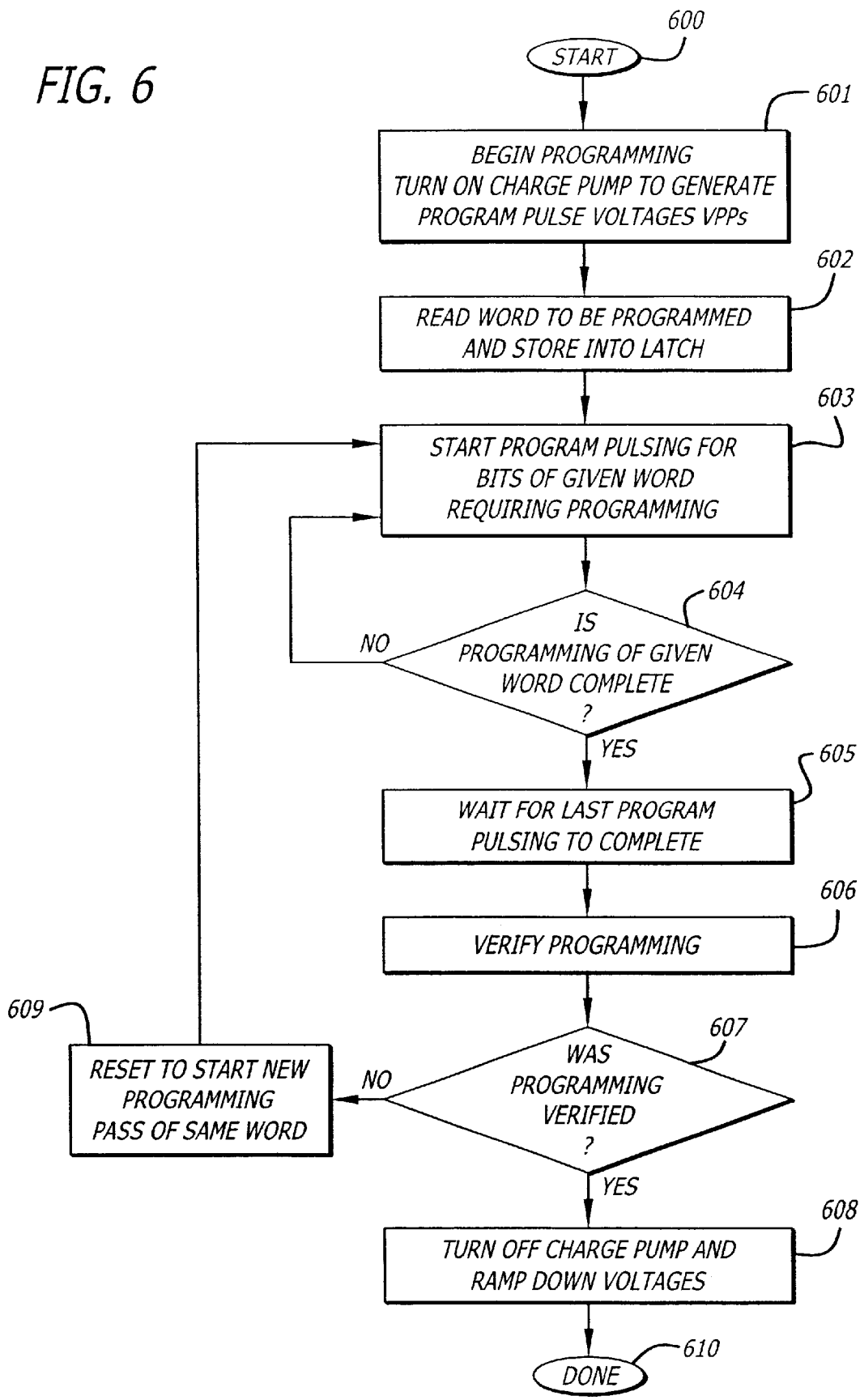
FIG. 6 illustrates a flow chart of the functionality of the microcode of the microcode program controller of FIGS. 4A–4B.

Referring now to FIG. 6, a flow chart of the functionality of the microcode of the microcode program controller 401 is illustrated. At step 600 the microcode program controller 401 starts its execution of program steps. At step 601, the controller 401 turns on the charge pump 405 to generate programming pulse voltages VPP and their associated currents. Next at step 602, the controller 401 reads the bits of the program word and stores each of them into single bit latches or one parallel latch. At step 603, the controller 401 starts the program pulsing of EEPROM cells indicated by the ripple bit calculator to match the bits of the program word. LDGETNIB is toggled to generate LDSPROGO for the ripple bit calculator to calculate the next set of bits of the program word and detect if the programming is completed by generation of the word done signal. At step 604, the controller 401 determines whether the programming of bits is complete by checking the word done signal 407. If the programming is incomplete, the controller returns to step 603 and begins programming other bits of EEPROM cells to match bits of the program word. If at step 604 it is determined that the programming of bits is completed for the given program word, the controller jumps to step 605. At step 605, the controller waits a period of time for the last program pulsing to be completed. At step 606, the controller 401 causes the programming verifier 404 to verify the programming of the EEPROM cells matches the given program word. Also, the contents of latch 412' or each latch 412 is modified to indicate which were verified correctly and cleared so as to not be reprogrammed on the next pass. At step 607, the controller 401 determines whether or not the programming was verified by checking the control signals from the programming verifier 404. If the programming was verified, the controller 401 jumps to step 608. At step 608, the controller signals to the charge pump 405 to turn off and ramp down its programming voltages and respective currents. The controller 410 then jumps to step 610 when it is done programming a given program word and waits for the next program word to perform a programming cycle on. If the programming was not verified as being correct at step 607, the controller 401 jumps to step 609. At step 609, the controller 401 resets the state of the programming back to its initial state before programming the given program word to prepare to program once again the same given program word. LDRSTNIB is toggled to generate LDRSMASK which clears latch 522. Then the controller 401 jumps to step 603 where it starts the programming cycle over again using the modified program word. In this manner the bits of the EEPROM cells are assured to match the bits of the given program word.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art. For example, the present invention has been described herein with reference to four bits being programmed in parallel together. Other bit widths may be programmed in parallel together utilizing more efficient EEPROM cells and or more efficient charge pumps. Furthermore, the EEPROM memory incorporating the present invention has been shown to be utilized in cell phones, PDAs, and memory cards but can be utilized in other electronic devices as well. Additionally, the present invention of the program control has been described for controlling the programming of an EEPROM memory array but is equally applicable to programming other types of non-volatile memory arrays. Furthermore, the present invention has been described with reference to a sixteen bit program word but can be expanded or contracted to count the number of bits that need programming within any given program word size. Additionally, the present invention has been described in detail as to counting the number of zeroes that need programming but can also be altered to count a number of ones that need programming. Additionally, it is possible to implement the present invention or some of its features in hardware, firmware, software or a combination thereof where the software is provided in a processor readable storage medium such as a magnetic, optical, or semiconductor storage medium.

What is claimed is:

1. A cellular telephone comprising:
   a micro-processor to control operation of the cellular telephone;
   a radio transceiver coupled to the micro-processor, the radio transceiver to transceive radio frequency signals; and
   an electrically programmable memory coupled to the micro-processor, the electrically programmable memory to store telephone numbers, the electrically programmable memory having
      an array of electrically programmable memory cells, and
      a bit sequence program controller coupled to the array of electrically programmable memory cells, the bit sequence program controller, in response to bits in a program word, to skip the memory cells in the array that do not require programming and to program in sequence the memory cells which correspond to the bits that require programming in the program word.

2. The cellular telephone of claim 1 wherein,
the skipping of the memory cells in the array that do not require programming to reduce the time to store the telephone number and to reduce the number of write cycles to the memory cells that are skipped.

3. The cellular telephone of claim 1 further comprising:
a display coupled to the micro-processor, the display to display information to a user regarding the operation of the cellular telephone.

4. The cellular telephone of claim 1 wherein,
the bit sequence program controller determines the bits that require programming by comparing the bits of the program word with an erased logical state of a memory cell.

5. The cellular telephone of claim 4 wherein,
the erased logical state of the memory cell is a logical zero.

6. The cellular telephone of claim 4 wherein,
the erased logical state of the memory cell is a logical one.

7. The cellular telephone of claim 1 wherein,
the bit sequence program controller to determine the bits that require programming by comparing the bits of the program word with a logical state of bits of a word of memory cells read out of the array of electrically programmable memory cells.

8. The cellular telephone of claim 1 wherein,
the bit sequence program controller includes a ripple carry adder to count a number of the bits that require programming in the program word.

9. The cellular telephone of claim 8 wherein,
the ripple carry adder to count the number of the bits in the program word that are in an erased logical state.

10. The cellular telephone of claim 8 wherein,
the ripple carry adder to count the number of the bits in the program word that are not in an erased logical state.

11. A personal digital assistant comprising:
a micro-processor to control operation of the personal digital assistant;
an input device coupled to the micro-processor, the input device to receive data into the personal digital assistant;
a display coupled to the micro-processor, the display to display information to a user regarding the operation of the personal digital assistant; and
an electrically programmable memory coupled to the micro-processor, the electrically programmable memory to store data in the personal digital assistant, the electrically programmable memory having
   an array of electrically programmable memory cells, and
   a bit sequence program controller coupled to the array of electrically programmable memory cells, the bit sequence program controller, in response to bits in a program word, to skip the memory cells in the array that do not require programming and to program in sequence the memory cells which correspond to the bits that require programming in the program word, the bit sequence program controller including
      a ripple bit calculator to count the number of bits requiring programming in the program word and to indicate a bit sequence of non-volatile memory cells in the word of non-volatile memory cells that require programming.

12. The personal digital assistant of claim 11 wherein,
the skipping of the memory cells in the array that do not require programming to reduce the time to store data and to reduce the number of write cycles to the memory cells that are skipped.

13. A personal digital assistant comprising:
a micro-processor to control operation of the personal digital assistant;
an input device coupled to the micro-processor, the input device to receive data into the personal digital assistant;
a display coupled to the micro-processor, the display to display information to a user regarding the operation of the personal digital assistant; and
an electrically programmable memory coupled to the micro-processor, the electrically programmable memory to store data in the personal digital assistant, the electrically programmable memory having
an array of electrically programmable memory cells, and
a bit sequence program controller coupled to the array of electrically programmable memory cells, the bit sequence program controller, in response to bits in a program word, to skip the memory cells in the array that do not require programming and to program in sequence the memory cells which correspond to the bits that require programming in the program word, wherein the bit sequence program controller includes
a parallel program controller to control a number of bits to program in parallel together, and
a ripple bit calculator coupled to the parallel program controller, the ripple bit calculator receiving the program word to count the number of bits requiring programming in the program word and to indicate a bit sequence of non-volatile memory cells in the word of non-volatile memory cells that require programming, and
a programming complete detector coupled to the ripple bit calculator, the programming complete detector receiving a final count signal from the ripple bit calculator to determine if all bits within the program word requiring programming into the word of the non-volatile memory cells have been programmed.

14. The personal digital assistant of claim 13 wherein, the bit sequence program controller further includes
a programming verifier to verify that all bits in the word of the non-volatile memory cells that required programming to correspond to the program word were programmed.

15. The personal digital assistant of claim 14 wherein, the bit sequence program controller further includes
a verify twiddler to compare the logical state of bits of the program word with the logical state of the programmed bits in the word of the non-volatile memory cells to determine which bits of the program word still require programming.

16. The personal digital assistant of claim 15 wherein, the bit sequence program controller further includes
a latch coupled to the verify twiddler to initially store the logical state of bits of the program word;
wherein, the verify twiddler modifies the logical state of the bits of the program word stored into the latch to indicate those that do not need programming; and further comprising,
a verify clean detector to analyze a modified logical state of all bits of the program word stored in the latch to determine if the program word was properly programmed into a word of non-volatile memory cells in the array of non-volatile memory cells.

17. The personal digital assistant of claim 13 wherein, the ripple bit calculator comprises,
a plurality of bit slices, each bit slice corresponding to a bit of the program word, each bit slice includes,
a bit calculator, the bit calculator comparing the corresponding bit of the program word to an erased logical state of the memory cell to indicate if a corresponding memory cell requires programming, the bit calculator receiving a count input signal and generating a count output signal responsive to the count input signal and the corresponding bit of the program word.

18. The personal digital assistant of claim 17 wherein, each bit slice of the ripple bit calculator further includes,
bit mask logic to mask the corresponding bit of the program word after the corresponding memory cell has been programmed.

19. The personal digital assistant of claim 13 wherein, the programming complete detector receives an injected initial count signal from the parallel program controller and compares it with the final count signal from the ripple bit calculator to determine if all bits within the program word requiring programming into the word of the non-volatile memory cells have been programmed.

20. The personal digital assistant of claim 19 wherein, the comparison by programming complete detector between the injected initial count signal and the final count signal is a match indicating that programming into the non-volatile memory cells is completed and the programming complete detector generates a word done signal.

21. The personal digital assistant of claim 11 wherein, the electrically programmable memory further includes
a charge pump to generate the pulse voltage and current necessary to program a maximum number of bits to program in parallel together.

22. A memory card comprising:
a pluggable connector to pluggably connect in and out of a system; and
a non-volatile memory device coupled to the pluggable connector, the non-volatile memory device to store data when powered on and powered off,
the non-volatile memory device including,
an array of programmable non-volatile memory cells, and,
a bit sequence program controller coupled to the array of programmable non-volatile memory cells, the bit sequence program controller to determine bits in a program word which require programming into the programmable non-volatile memory cells and to determine bits in the program word which do not require programming into the programmable non-volatile memory cells, the bit sequence program controller to program in sequence the non-volatile memory cells in the array of programmable non-volatile memory cells which correspond to the bits that require programming and to skip the non-volatile memory cells in the array of programmable non-volatile memory cells which do not require programming, wherein the bit sequence program controller includes
a ripple bit calculator to count the number of bits requiring programming in the program word and to indicate a bit sequence of non-volatile memory cells in the word of non-volatile memory cells that require programming.

23. The memory card of claim 22 wherein,
the skipping of the programmable non-volatile memory cells in the array that do not require programming to reduce the time to store data and to reduce the number of write cycles to the non-volatile memory cells that are skipped.

24. The memory card of claim 22 wherein,
the bit sequence program controller determines the bits that require programming by comparing the bits of the program word with an erased logical state of a programmable non-volatile memory cell.

25. The memory card of claim 22 wherein,
the erased logical state of the programmable non-volatile memory cell is a logical zero.

26. The memory card of claim 22 wherein,
the erased logical state of the programmable non-volatile memory cell is a logical one.

27. The memory card of claim 22 wherein,
the bit sequence program controller counts a number of the bits that require programming in the program word by counting the number of bits of the program word that are not in an erased logical state.

28. The memory card of claim 22 wherein,
the bit sequence program controller counts a number of the bits that require programming in the program word by counting the number of bits of the program word that are in an erased logical state.

29. A memory card comprising:
a connector to connect to a system; and
a non-volatile memory device coupled to the connector, the non-volatile memory device to store data when powered on and powered off,
the non-volatile memory device including,
an array of programmable non-volatile memory cells, and,
a bit sequence program controller coupled to the array of programmable non-volatile memory cells, the bit sequence program controller to determine bits in a program word which require programming into the programmable non-volatile memory cells and to determine bits in the program word which do not require programming into the programmable non-volatile memory cells, the bit sequence program controller to program in sequence the non-volatile memory cells in the array of programmable non-volatile memory cells which correspond to the bits that require programming and to skip the non-volatile memory cells in the array of programmable non-volatile memory cells which do not require programming, wherein the bit sequence program controller uses a ripple carry adder to count the number of the bits that require programming in the program word.

30. The memory card of claim 22 wherein,
the array of programmable non-volatile memory cells is an array of electrically erasable programmable read only memory (EEPROM) cells.

31. The memory card of claim 22 wherein,
the array of programmable non-volatile memory cells is an array of electrically programmable read only memory (EPROM) cells.

32. In a memory card, a method of programming bits in sequence comprising:
counting a number of bits in a program word requiring programming into memory cells and not counting those in the program word that do not require programming; indicating the bit positions of those bits in the program word that require programming; and
programming in parallel together a selected number of the indicated bit positions of those bits in the program word that require programming.

33. The method of programming bits in sequence of claim 32 wherein,
the bits requiring programming in the program word are those bits having a logical state opposite an erased state of a memory cell.

34. The method of programming bits in sequence of claim 33 wherein,
the erased logical state of the memory cell is a logical zero.

35. The method of programming bits in sequence of claim 33 wherein,
the erased logical state of the memory cell is a logical one.

36. The method of programming bits in sequence of claim 32 further comprising:
masking out programmed bit positions from the counting of the number of bits in the program word that require programming;
and indicating the bit position in the program word that require programming; and
repeating the steps of the counting, the indicating and the programming.

37. The method of programming bits in sequence of claim 36 further comprising:
repeating the steps of the counting, the indicating, the programming, and the masking until all bits of the program word that require programming have been programmed into the memory cells.

38. The method of programming bits in sequence of claim 36 further comprising:
comparing the count of the number of bits in the program word with a number of bits to program in parallel together to determine if all bits of the program word that require programming have been programmed into the memory cells.

39. The personal digital assistant of claim 13 wherein,
the skipping of the memory cells in the array that do not require programming to reduce the time to store data and to reduce the number of write cycles to the memory cells that are skipped.

40. The personal digital assistant of claim 13 wherein,
the electrically programmable memory further includes a charge pump to generate the pulse voltage and current necessary to program a maximum number of bits to program in parallel together.

41. The memory card of claim 29 wherein,
the skipping of the programmable non-volatile memory cells in the array that do not require programming to reduce the time to store data and to reduce the number of write cycles to the non-volatile memory cells that are skipped.

42. The memory card of claim 29 wherein,
the bit sequence program controller determines the bits that require programming by comparing the bits of the program word with an erased logical state of a programmable non-volatile memory cell.

43. The memory card of claim 29 wherein,
the erased logical state of the programmable non-volatile memory cell is a logical zero.

44. The memory card of claim 29 wherein,
the erased logical state of the programmable non-volatile memory cell is a logical one.

45. The memory card of claim 29 wherein, the bit sequence program controller counts a number of the bits that require programming in the program word by counting the number of bits of the program word that are not in an erased logical state.

46. The memory card of claim 29 wherein, the bit sequence program controller counts a number of the bits that require programming in the program word by counting the number of bits of the program word that are in an erased logical state.

47. The memory card of claim 29 wherein, the array of programmable non-volatile memory cells is an array of electrically erasable programmable read only memory (EEPROM) cells.

48. The memory card of claim 29 wherein, the array of programmable non-volatile memory cells is an array of electrically programmable read only memory (EPROM) cells.

* * * * *